US009343402B2

(12) United States Patent
Sakata et al.

(10) Patent No.: US 9,343,402 B2
(45) Date of Patent: May 17, 2016

(54) SEMICONDUCTOR DEVICE HAVING TI- AND N-CONTAINING LAYER, AND MANUFACTURING METHOD OF SAME

(71) Applicant: Kabushiki Kaisha Toshiba, Tokyo (JP)

(72) Inventors: Atsuko Sakata, Yokohama (JP); Jun-ichi Wada, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/805,570

(22) Filed: Jul. 22, 2015

(65) Prior Publication Data

US 2015/0333006 A1 Nov. 19, 2015

Related U.S. Application Data

(62) Division of application No. 11/878,020, filed on Jul. 20, 2007, now Pat. No. 9,129,970.

(30) Foreign Application Priority Data

Jul. 21, 2006 (JP) .................................. 2006-200094

(51) Int. Cl.
*H01L 23/522* (2006.01)
*H01L 21/285* (2006.01)
(Continued)

(52) U.S. Cl.
CPC ........ *H01L 23/5226* (2013.01); *H01L 21/2855* (2013.01); *H01L 21/76835* (2013.01);
(Continued)

(58) Field of Classification Search
CPC ..................... H01L 23/5226; H01L 23/53238; H01L 23/53295; H01L 21/76865; H01L 21/76846; H01L 21/2855; H01L 21/76835; H01L 21/76843; H01L 2924/0002
See application file for complete search history.

(56) References Cited

U.S. PATENT DOCUMENTS 4,681,818 A 7/1987 Unnam et al.
5,135,801 A 8/1992 Nystrom et al.
(Continued)

FOREIGN PATENT DOCUMENTS

JP 10125782 5/1998
JP 2000-124307 4/2000
(Continued)

OTHER PUBLICATIONS

Sakata et al., "Reliability Improvement by Adopting Ti-barrier Metal for Porous Low-k ILD Structure", Proceedings of the IEEE 2006 International Interconnect Technology Conference, pp. 101-103, (Jun. 5-7, 2006).

(Continued)

*Primary Examiner* — Mohammad Islam
*Assistant Examiner* — John P Dulka
(74) *Attorney, Agent, or Firm* — Finnegan, Henderson, Farabow, Garrett & Dunner, LLP

(57) ABSTRACT

A manufacturing method of a semiconductor device comprises releasing an oxidation source included in an interlayer dielectric film having an opening portion formed on a surface thereof and being present on the surface of the interlayer dielectric film at a first substrate temperature, forming a first layer containing Ti and N to contact with at least a part of the interlayer dielectric film at a second substrate temperature lower than the first substrate temperature, wherein a Ti content in the first layer is more than 50 at % in all components, provided that oxygen and precious metals are excluded from the all components, and forming a Cu metal layer above the first layer.

13 Claims, 13 Drawing Sheets

(51) Int. Cl.
*H01L 21/768* (2006.01)
*H01L 23/532* (2006.01)

(52) U.S. Cl.
CPC .... *H01L21/76843* (2013.01); *H01L 21/76846* (2013.01); *H01L 21/76865* (2013.01); *H01L 23/53238* (2013.01); *H01L 23/53295* (2013.01); *H01L 2924/0002* (2013.01)

(56) References Cited

U.S. PATENT DOCUMENTS

| | | | |
|---|---|---|---|
| 6,090,701 A | * | 7/2000 | Hasunuma ........ H01L 21/76882 257/E21.588 |
| 6,348,402 B1 | | 2/2002 | Kawanoue et al. |
| 6,436,819 B1 | * | 8/2002 | Zhang ............... H01L 21/76846 438/656 |
| 6,436,850 B1 | | 8/2002 | Morales |
| 6,975,033 B2 | | 12/2005 | Ito et al. |
| 7,351,656 B2 | | 4/2008 | Sakata et al. |
| 7,459,786 B2 | | 12/2008 | Shimazu et al. |
| 7,791,202 B2 | | 9/2010 | Sakata et al. |
| 7,994,054 B2 | | 8/2011 | Sakata et al. |
| 8,148,274 B2 | | 4/2012 | Wada et al. |
| 2002/0155695 A1 | | 10/2002 | Lee et al. |
| 2003/0214039 A1 | | 11/2003 | Yoon |
| 2004/0048460 A1 | | 3/2004 | Asahina et al. |
| 2005/0186793 A1 | | 8/2005 | Omoto et al. |
| 2006/0202336 A1 | | 9/2006 | Kajita et al. |
| 2006/0214305 A1 | | 9/2006 | Sakata et al. |

FOREIGN PATENT DOCUMENTS

| | | | | |
|---|---|---|---|---|
| JP | 2000-269213 | | 9/2000 | |
| JP | 2003-338540 | | 11/2003 | |
| JP | 2004-71956 | | 3/2004 | |
| KR | 2003-89756 | | 11/2003 | |
| KR | 20030089756 A | * | 11/2003 | ........ H01L 21/76843 |
| TW | 452835 | | 9/2001 | |
| TW | 200601495 | | 1/2006 | |

OTHER PUBLICATIONS

Notice of Reasons for Refusal issued by the Taiwanese Patent Office on Jan. 13, 2011, for Taiwanese Patent Application No. 096125778, and English-language translation thereof.

* cited by examiner

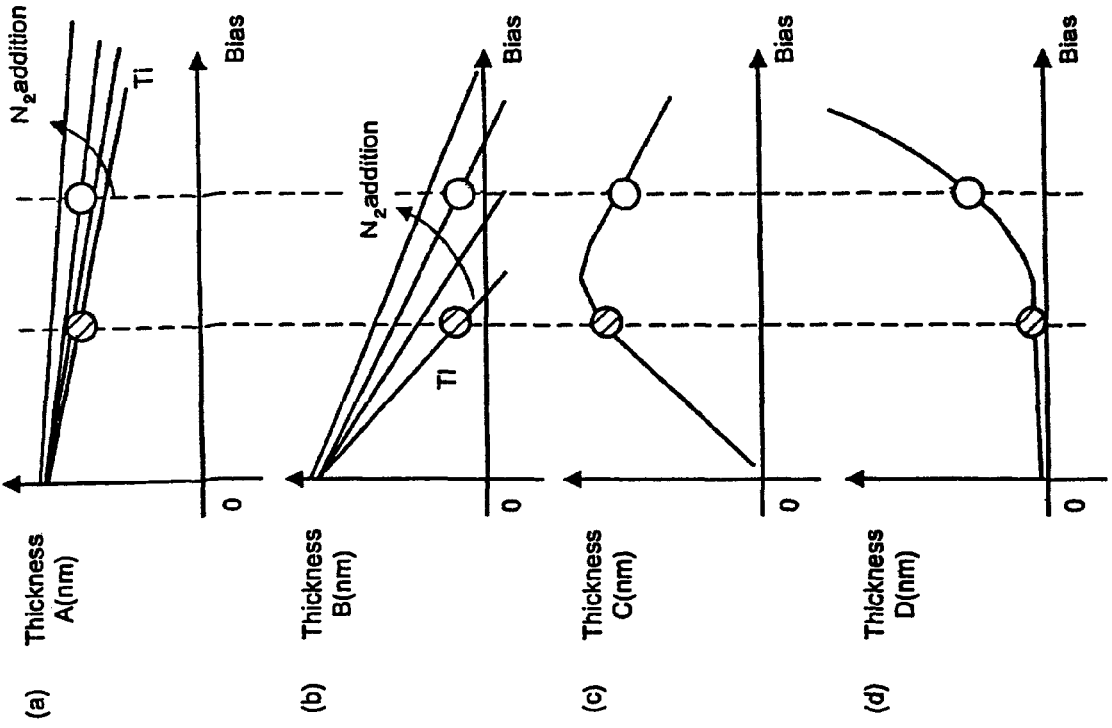
FIG. 17
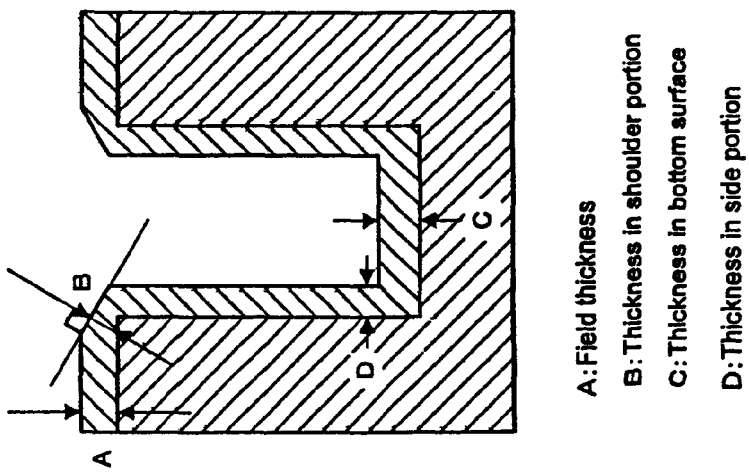

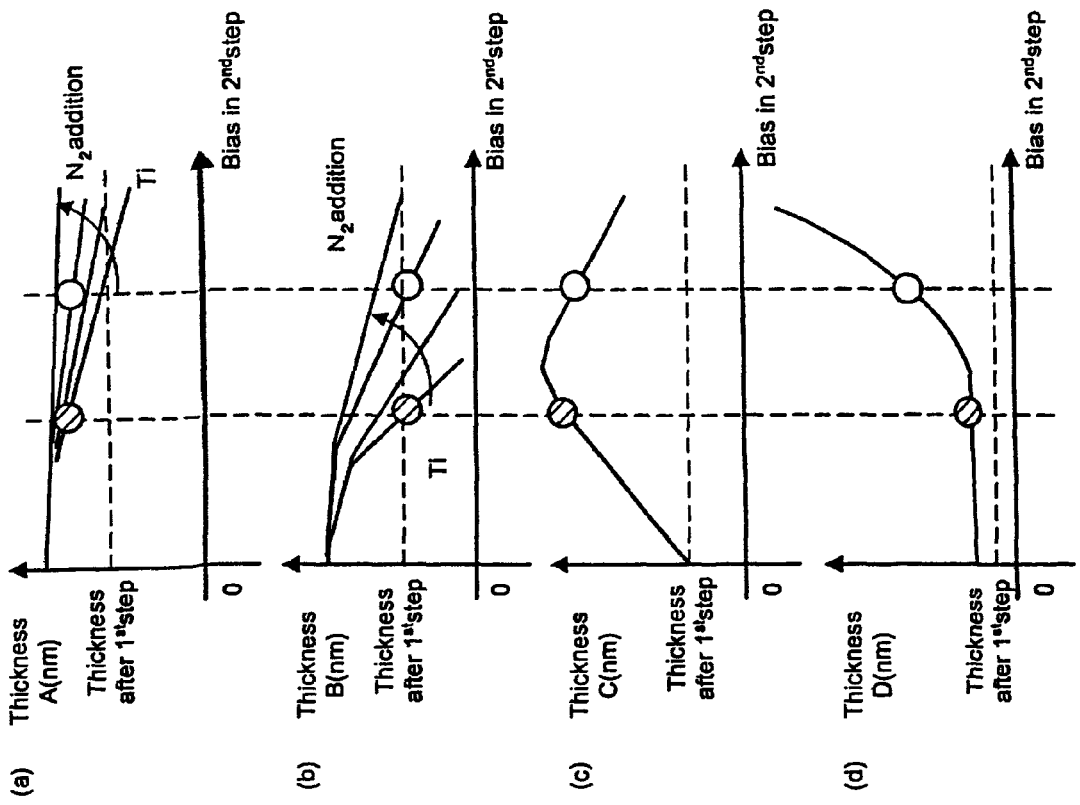
FIG. 18
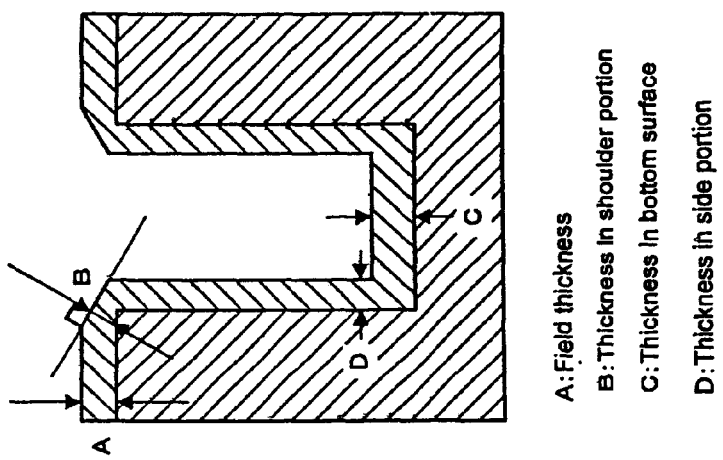

Ratio = Thickness in each portion / Field thickness x 100

(a)

(b)

(c)

SEMICONDUCTOR DEVICE HAVING TI- AND N-CONTAINING LAYER, AND MANUFACTURING METHOD OF SAME

CROSS-REFERENCE TO RELATED APPLICATIONS

This is a division of application Ser. No. 11/878,020, filed Jul. 20, 2007, which is incorporated herein by reference. Further, this application is based upon and claims the benefit of priority from the Japanese Patent Application No. 2006-200094 filed on Jul. 21, 2006; the entire contents of which are incorporated herein by reference.

BACKGROUND

1. Field of the Invention

The present application relates to a manufacturing method of a semiconductor device and the semiconductor device.

2. Description of the Related Art

For multilevel metalization of semiconductor integrated circuit (LSI), a copper (Cu) film which has a low specific electrical resistance is used, and a Damascene interconnection method, which buries Cu films into grooves and via holes formed in interlayer dielectric films, has been mainly used. A width of interconnection line becomes smaller with the miniaturization of LSI and a thickness of the line has a tendency to be thinner for decreasing the capacity between lines. For this reason, in the fine Damascene interconnection, an area ratio of a barrier metal layer having a high specific resistance in a line cross sectional area has a large effect on the line resistance. That is, as a thickness of the barrier layer is thinner, the resistance of the Damascene interconnection becomes lower. However, it is simultaneously required for the barrier metal layer to prevent the diffusion of Cu atoms to the interlayer dielectric films, to have an adhesiveness with the Cu film, and to have an adhesiveness with the interlayer dielectric film.

Particularly, the adhesiveness between the barrier metal layer and the Cu film is very important for the resistance to an electro-migration (EM) of the wirings and a stress-migration (SM) of the wirings. Further, the barrier metal layer is required to have the most thin film thickness to satisfy above requirements and to be formed so as to conform to the shape of bottom surface and side surface of the groove formed in the layer insulation film with a uniform thickness.

Next, we will describe the recent state with respect to the forming of a thin barrier metal layer. In a general physical vapor deposition method (PVD method), it is difficult to cover the difference in level. Therefore, in a dual Damascene structure which is formed by burying grooves and via holes formed in an interconnection dielectric film with metals, it is difficult to form conformal barrier metal layers by using the PVD method. For that reason, an ionization PVD method has been developed to use for forming the barrier metal layer, the method including biasing a substrate, drawing metal ions thereto to improve bottom coverage, and using re-sputtering effect of metal or forming-gas ions to improve side coverage.

However, accompanying with further requirements of miniaturization and high aspect ratio of interconnection lines, conformal forming of barrier metal layer will be more and more difficult hereafter. On the other hand, although it is possible to form conformal barrier metal layers using the chemical vapor deposition method (CVD method), it is impossible to adapt a high temperature process at the interconnecting process, due to the problem of poor SM property. For that reason, in the CVD method, there is a problem that feed gases for forming the barrier metal layer which can be decomposed at an allowable temperature of interconnecting processes are limited.

Further, as a conformal film forming method of a very thin film, the atomic layer depositing method (ALD method) which stacks one atomic layer at a time on a surface of the substrate layer. The ALD method is not suitable for forming a thick film, but it is possible to form a very thin film and to cover the difference in level by the method. However, also even in the ALD method, there is a problem as the CVD method that it is difficult to thermally decompose feed gases within an allowable temperature range at the interconnecting processes.

On the other hand, in a recent interlayer dielectric film, in order to suppress a signal delay an insulation film having a low dielectric constant has been used. In the low dielectric constant insulation films, in both organic type insulation films and inorganic insulation films, much carbon (C) and much pores are contained and oxidation sources such as water ($H_2O$) are trapped. An adhesiveness of the barrier metal layer with the Cu film is determined by two kind of adhesiveness. The first is an adhesiveness determined according to material, and the second is an adhesiveness with a deterioration of the barrier metal layer which generates with passage of time. Particularly, the change of adhesiveness with passage of time is very serious, because the changes occur not only in the manufacturing processes but also in an actual use. The changes in an actual use cause SM and EM errors and the like. In the processes of work including plasma irradiation, electron beam irradiation or ultraviolet irradiation and in a curing process of an insulation film, molecules containing carbons are emitted, the insulation films are damaged, and water is easily adsorbed at sites of which emitted carbons are bonded.

One of the reasons of deterioration of barrier metal layer with passage of time during the manufacturing processes or actual uses is based on the oxidation of barrier metal layers with oxidation sources containing in the insulation film and the degradation of adhesiveness with Cu. And in other case, the barrier metal layers are carbonized with molecules containing carbon (C) to be deteriorated.

As mentioned above, it is considered that to suppress the deterioration of barrier metal layers and to secure the adhesiveness will be more and more difficult hereafter. Further although JP-A 2000-269213, for example, has disclosed a process of forming oxidation film at boundary surface in advance, the process could not obtain desired results, because oxides having large valence and low density are formed when the oxides are actively formed.

SUMMARY

An aspect of the present invention relates to a manufacturing method of a semiconductor device, comprising: releasing an oxidation source included in an interlayer dielectric film having an opening portion formed on a surface thereof and being present on the surface of the interlayer dielectric film at a first substrate temperature; forming a first layer containing Ti and N to contact with at least a part of the interlayer dielectric film at a second substrate temperature lower than the first substrate temperature, wherein a Ti content in the first layer is more than 50 at % in all components, provided that oxygen and precious metals are excluded from the all components; and forming a Cu metal layer above the first layer.

Another aspect of the present invention relates to a manufacturing method of a semiconductor device, comprising: forming a first layer containing Ti and N to contact with at least a part of an interlayer dielectric film having an opening portion formed on a surface thereof, wherein a Ti content in the first layer is more than 50 at % in all components, provided that oxygen and precious metals are excluded from all the components; oxidizing at least a part of the first layer with an oxidation source remaining in the interlayer dielectric film; and forming a Cu metal layer above the first layer.

Further, another aspect of the present invention relates to a manufacturing method of a semiconductor device, comprising: forming a first layer containing Ti and N to contact with at least a part of an interlayer dielectric film having an opening portion formed on a surface thereof, wherein a Ti content in the first layer is more than 50 at % in all components, provided that oxygen and precious metals are excluded from the all components; and forming a Cu metal layer above the first layer to forma predetermined compound in an interface thereof through a reaction between Ti and Cu.

Furthermore, another aspect of the present invention relates to a semiconductor device comprising: an interlayer dielectric film having an opening portion formed on a surface thereof; a first layer formed on the interlayer dielectric film and containing Ti and N, wherein a Ti content in the first layer is more than 50 at % in all components, provided that oxygen and precious metals are excluded from the all components; a second layer formed on the first layer, the second layer being formed of Ti or TiM, wherein M is at least one metal selected from precious metals; and a Cu metal layer formed on the second layer to bury the opening portion formed in the interlayer dielectric film.

BRIEF DESCRIPTION OF THE DRAWINGS

FIG. 17 shows a coverage property of a $TiN_x$ film formed by applying bias for a predetermined time at the first step.

FIG. 18 shows a coverage property of a $TiN_x$ film formed by applying bias for a predetermined time at the second step.

DETAILED DESCRIPTION

Figure 1:
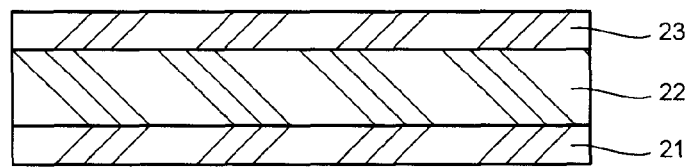
FIG. 1 is a cross sectional view showing a process of manufacturing method of a semiconductor device according to the first embodiment of the present invention.

Hereinafter, we will describe embodiments of the present invention based on the drawings, as follows. However, the drawings are merely provided for the illustration, and do not limit the present invention.

First Embodiment

First, we will describe a manufacturing method of the semiconductor device of the first embodiment of the present invention. FIGS. 1 to 12 are views showing manufacturing processes of the first embodiment, in turn. In the present embodiment, we will describe regarding the case of forming a multilayer interconnection having the dual Damascene structure, which is composed of a Cu film (Cu metal layer) as an interconnecting material, a barrier metal layer containing Ti an N, in which a Ti content is 50 at % or more in an all components provided that oxygen (O) and precious metal are excluded from the all components, and an insulation film which is formed of polyarylene ether film (hereinafter, referred to PAE) as an organic low dielectric constant insulation film, a carbon-containing silicon oxide film (hereinafter referred to SiCO) as an inorganic low dielectric constant insulation film, and the like.

In the above, a layer containing exceeding 50 at % of Ti can be easily formed by sputtering. Thus, in the present embodiment and the following embodiments, if not any specific notice, it is described that the layer is formed by sputtering.

Generally, the sputtering modes of nitride is divided to a nitriding mode and a non-nitriding mode. This is because the sputtering modes are distinguished depending on the state of surface of target when nitrogen is introduced into an apparatus. For example, as shown in the hysteresis diagram in FIG. 13 and the like, when the horizontal axis is a flow rate of $N_2$ and the vertical axis is a pressure in a chamber, in a region of small flow rate of $N_2$ an increase of pressure is small, but in a region of large flow rate of $N_2$ an increase of pressure is large. The region where the increase of pressure is small is referred to non-nitriding mode and the region where the increase of pressure is large is referred to nitriding mode. "Non-nitriding mode" and "nitriding mode" may be referred to "Non-poison mode" and "Poison mode", respectively.

In the non-nitriding mode, the surface of target has mainly mother metal (for example, Ti), and Ti being in a state of Ti at the surface of target is sputtered, and on the way to a substrate or on the surface of substrate nitriding is performed. On the other hand, in the nitriding mode, the surface of target is fully nitrided, the surface having the formed nitride is sputtered, thus a film having a normal composition, that is, Ti:N is nearly 1:1, is formed.

In the case of forming a layer having the above-mentioned Ti content of more than 50 at % by sputtering, it is possible to form in "non-nitriding mode", that is, "Non-poison mode". In contrast, a layer containing Ti and N and a Ti content of 50 at % or less in an all components excluding oxygen (O) and precious metals can be formed by sputtering in the nitriding mode, that is, "Poison mode".

Accordingly, in the present embodiment and the following embodiments, and in the drawings of the present application, if it is not any notice, by the sputtering method, a layer in which the above mentioned Ti content is more than 50 at % and a layer in which a Ti content is 50% or less are formed. In these cases, the terms of "non-nitriding mode" Ti film or "Non-poison mode" Ti film and "nitriding mode" Ti film or "Poison mode" Ti film will be used.

Further, instead of the above-mentioned sputtering method, it is possible to form a layer having a Ti content of more than 50 at % by CVD method or ALD method. In case of forming a layer by these methods, it is possible to form the layer by controlling the partial pressure ratio between material gas and other gas, for example, the partial pressure ratio of $N_2$ and ammonia. Alternatively, it is possible to form the layer by carrying out the method of accelerating the decomposition of material gases absorbed by plasma, radical irradiation.

Figure 2:
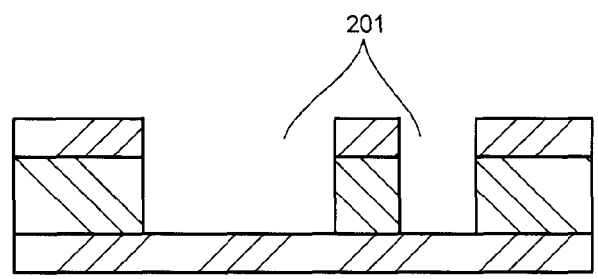
FIG. 2 is a cross sectional view showing a next process of the process shown in FIG. 1.
Figure 3:
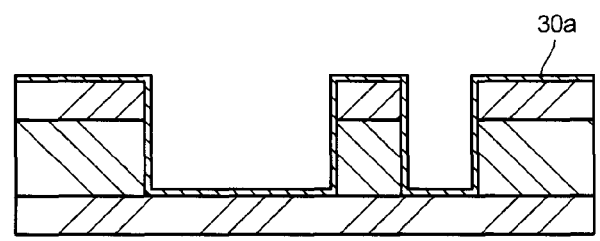
FIG. 3 is a cross sectional view showing a next process of the process shown in FIG. 2.

First, on a first silicon dioxide ($SiO_2$) film 21 having an exposed underlayer electrode (not shown in FIG. 1), a first PAE film 22 and a second $SiO_2$ film 23 are formed in turn to obtain a structure having a cross section shown in FIG. 1. Next, as shown in FIG. 2, using the photolithography technique and reactive ion etching (RIE) method and the like, the first PAE film 22 and second $SiO_2$ film 23 are selectively removed by etching to form a first interconnection groove 201 as an opening portion.

Figure 4:
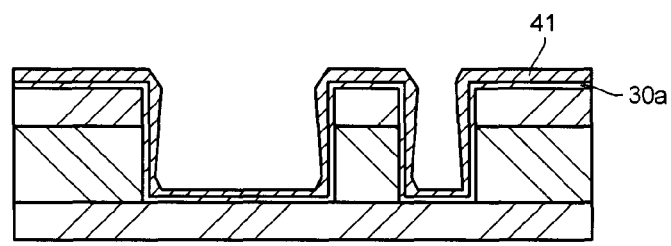
FIG. 4 is a cross sectional view showing a next process of the process shown in FIG. 3.
Figure 5:
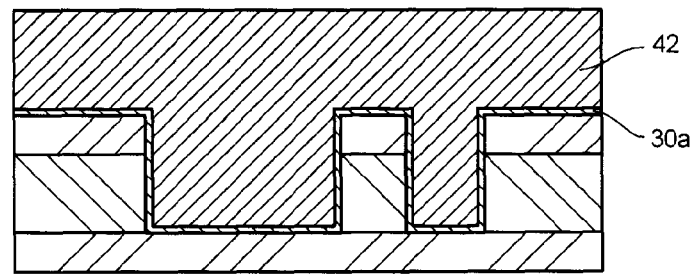
FIG. 5 is a cross sectional view showing a next process of the process shown in FIG. 4

Next, on the second $SiO_2$ film 23, on a side surface and a bottom surface of the first interconnection groove 201, a Ti film 30a is formed as a barrier metal layer. The Ti film 30a is formed with good coverage property to the difference in level, to obtain a structure shown in FIG. 3. Subsequently, as shown in FIG. 4, a first Cu seed film 41 is formed, and after steps of plating filling and heat-treating, a structure having a cross section shown in FIG. 5 is obtained. This heat-treating process is performed to obtain Cu having a large grain size, for suppressing a change of film property with time which is occurred by the self-aging and the like of the first Cu plated film 42. In FIG. 5, the whole Cu metal layer containing the seed film 41 is shown as the first Cu plated film 42.

Figure 6:
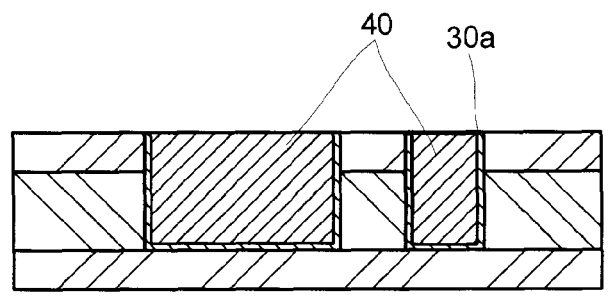
FIG. 6 is a cross sectional view showing a next process of the process shown in FIG. 5.

Subsequently, a CMP process is conducted to the Ti film 30a and the first Cu plated film 42 to obtain a structure having a cross section shown in FIG. 6. By conducting the CMP process, the Ti film 30a and the first Cu plated film 42 constitute a first wiring layer 40.

Figure 7:
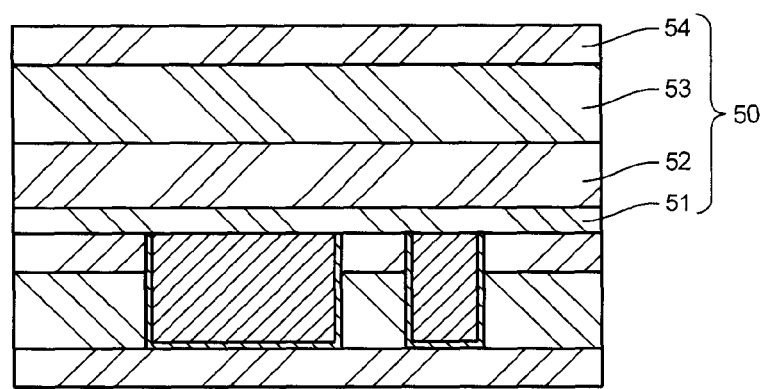
FIG. 7 is a cross sectional view showing a next process of the process shown in FIG. 6.

Next, as shown in FIG. 7, a SiCN film 51, a SiCO film 52, a second PAE film 53, and a third $SiO_2$ film 54 are formed in turn. Here, the SiCN film 51 functions as a stopper film at the process using the RIE method, and as a diffusion prevention film of Cu. The third $SiO_2$ film 54 functions as a protective film at the process using the CMP method. Then, a interlayer dielectric film 50 is constituted of the SiCN film 51, the SiCO film 52, the second PAE film 53 and the third $SiO_2$ film 54.

Further, the interlayer dielectric film 50 can be also constituted of only at least one of the SiCO film 52 and the second PAE film 53. On the other hand, as mentioned above, when the interlayer dielectric film 50 is constituted of plural kinds of insulation films, if a porous film having a high hygroscopic property is used as at least one insulation film, an amount of oxidizing gases released from the insulation film is increased. The "porous film" means a film having many pores for decreasing a specific dielectric constant, for example, to about 3 or less.

Figure 8:
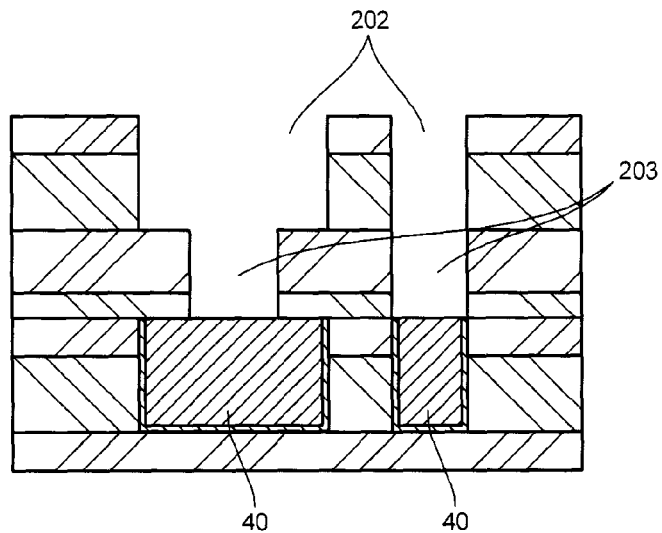
FIG. 8 is a cross sectional view showing a next process of the process shown in FIG. 7.
Figure 9:
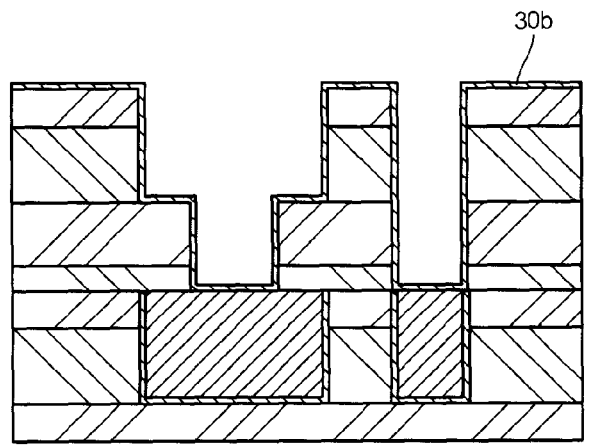
FIG. 9 is a cross sectional view showing a next process of the process shown in FIG. 8.

Next, the interlayer dielectric film 50 is selectively removed by etching using a photolithography technique and a RIE method, to form a second interconnection groove 202 and a via hole 203 as an opening portion. As the result, as shown in FIG. 8, a part of a surface of the first wiring layer 40 is exposed. Subsequently, the obtained structure is heat-treated under reducing atmosphere such as vacuum or $H_2$ gas, for example, at a temperature of 250 to 300° C. By this heat-treatment, $H_2O$ included in the interlayer dielectric film 50 or carbon-containing oxidation sources remaining in the interlayer dielectric film 50 which was produced by the breakage of chemical bond when forming the second interconnection groove 202 and via hole 203 are removed. At this time, when the heat-treatment is conducted under a reducing atmosphere, an oxide layer at the surface of the first wiring layer 40 exposed at the bottom surface of the via hole 203 can be reduced.

Next, a TiN film 30b of non-nitriding mode as a barrier metal layer is formed on a surface of the interlayer dielectric film 50. This TiN film 30b is formed with a good coverage to the difference of steps, and has a structure having a cross section shown in FIG. 9.

The TiN film 30b can be formed by the following method. A structure shown in FIG. 8 is conveyed in a chamber for ion beam sputtering, and is disposed on a susceptor which is held a desired temperature. Subsequently, the structure is adsorbed to the susceptor and is held at the same temperature as that of the susceptor. In this state, into the sputtering chamber held at a low pressure, Ar gas is introduced, for example, with a flow rate of 6 to 8 sccm, and minute amount of $N_2$, is introduced, for example, with a flow rate of 1 to 11 sccm, for producing sputtering, and using the ion beam sputtering method, a TiN film 30b, for example, a single layer having a thickness of 10 nm is formed, for example, with the condition of a substrate bias of 0 to 1000 W to the cathode condition of 18 kW. At this time, the substrate bias value suitable for obtaining good coverage to the flow rate of $N_2$ is properly selected.

Here, the TiN film 30b is formed at a second substrate temperature that is lower than a first substrate temperature at the heat treatment for removing oxidation sources. Concretely, when the heat treatment for removing oxidation sources is conducted at a temperature of 250° C., the TiN film 30b is formed at a temperature of less than 250° C. Further, when the heat treatment is conducted at 300° C., the TiN film 30b is formed at a temperature of less than 300° C.

As mentioned above, since the TiN film 30b is formed at the second temperature that is lower than the heat treatment temperature for removing the oxidation sources, the release of oxidation sources from the interlayer dielectric film 50 does not occur. For this reason, at the time of laminating, it is possible to form the TiN film 30b without including $TiO_x$ and the like. The reason of forming the TiN film 30b so as not to include $TiO_x$ and the like is in that the $TiO_x$ formed at the time of laminating by flying of barrier metal material in an atomic or molecular state forms Ti—O having broad atomic distance, because oxygen is bonded with Ti in a state that the Ti—Ti atomic bond is not yet formed. As the result, there is a tendency to form a film having low molecular density and low barrier property. To the above problem, by heat-treating and the like at the later forming process of a dielectric film and sintering process, the oxidation sources remaining in the interlayer dielectric film 50 are released, then a surface of a Ti film 30*b* contacting with the interlayer dielectric film 50 is oxidized to form an oxide film. Accordingly, the oxide film is formed by the diffusion and solid-solution of oxygen between the Ti—Ti atoms which have been already stabilized, thereby the film having high molecular density and closeness being obtained.

Further, the above oxide film suppresses the release of oxidation sources. Therefore, the oxidation of TiN film 30*b* is limited to a region near the interface with the interlayer dielectric film 50, and then the oxidation of TiN film 30*b* at the region far from the interface can be suppressed.

Figure 10:
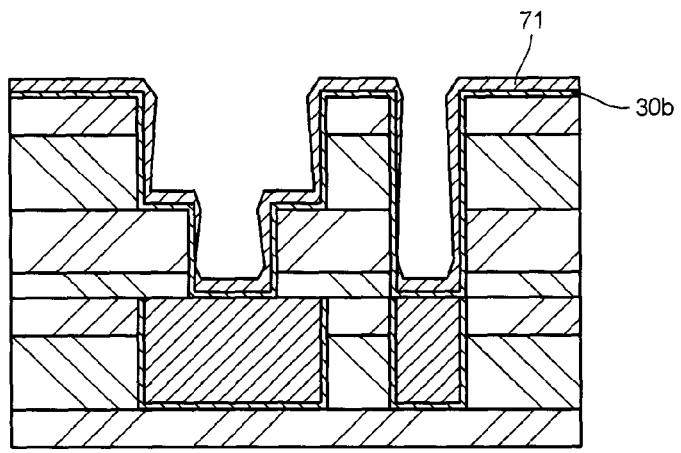
FIG. 10 is a cross sectional view showing a next process of the process shown in FIG. 9.
Figure 11:
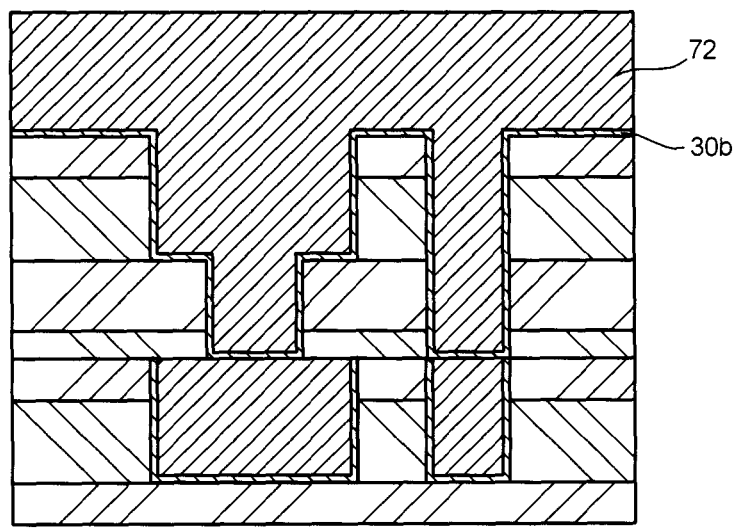
FIG. 11 is a cross sectional view showing a next process of the process shown in FIG. 10.
Figure 12:
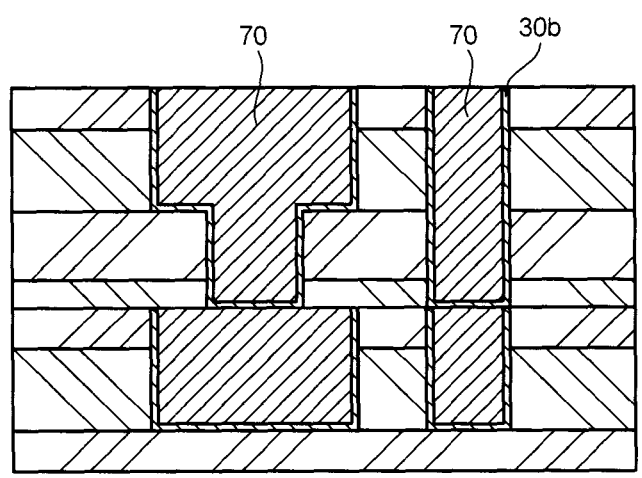
FIG. 12 is a cross sectional view showing a next process of the process shown in FIG. 11.

Next, as shown in FIG. 10, a second Cu seed film 71 is formed continuously under vacuum atmosphere. Subsequently, as shown in FIG. 11, a second plated layer 72 is formed to fill a second interconnection groove 202 and a via hole 203 using a plating apparatus, and is heat-treated. This heat treatment is conducted for preventing the change of film property with secular change due to the self-aging and the like of the second Cu plated film 72 with the object for making Cu particle size larger in advance. Thereafter, using the CMP method, the second Cu plated layer 72 and TiN film 30*b* are flattened, and a second interconnection layer 70 including the TiN film 30*b* and the second Cu plated layer 72 is formed, as shown in FIG. 12. Here, the whole Cu metal layer including the second Cu seed film 71 is shown as the second Cu plated layer 72.

Concretely, the second Cu seed film 71 and the second Cu plated film 72 are formed as the following processes. First, after forming the TiN film 30*b* as described above, a structural body shown in FIG. 9 is conveyed to a chamber for forming a Cu film under continuous vacuum atmosphere, the structural body is kept at a desired temperature, and the second Cu seed film 71 is formed as shown in FIG. 10. The second Cu seed film 71 may be formed by using the PVD method, the CVD method, or the ALD method, to obtain a desired film thickness such as about 60 nm.

Subsequently, the structural body is taken out in the atmosphere, and as shown in FIG. 11, the via hole 203 and the second interconnection groove 202 are buried with the second plated film 72. And in order to prevent the fluctuation of film properties with secular change due to the self-aging and the like in the second Cu plated film 72, a heat-treatment process (annealing after plating) for making the Cu particle size larger in advance is conducted. Annealing after plating is conducted under vacuum atmosphere, nitrogen gas atmosphere, or $N_2/H_2$ gas atmosphere, with the condition of 150° C. for 60 min. to 300° C. for 60 min. In these annealing conditions, the optimum temperature and time conditions will be changed depending on various plating conditions. Finally, the flattening of the second plated film 72 by using the CMP method is conducted, thereby Damascene structural body being obtained.

In the present embodiment, although the burying is conducted by the plating, a CVD method or ALD method may be also used.

When the interconnection structure formed by the above processes is used, it has been found that the stress migration (SM) property is improved compared with the conventional method, particularly, in a region having a low patterning density, which is easily degraded due to oxidation with the oxidation sources in a dielectric film.

Further, the realization of further multilayered structure comparing with the structural body shown in FIG. 12, can be achieved by repeating the processes shown in FIGS. 7 to 11.

The present embodiment is characterized by that when the second interconnection layer 70 is formed, a TiN film 30*b* formed in a non-nitriding mode is used. Previously, the inventors proposed to make the barrier metal layer more finer and to improve a barrier property to Cu, by the use of Ti and the like as a barrier metal material and the use of gas released from a hygroscopic dielectric film as an oxidation source for postoxidation (US 2006/0214305 A1).

However, as the result of various studies, the following problems has been clear. That is, at the time of forming a film of barrier metal, there is a problem that sufficient coverage can not be formed, particularly, side coverage can not be fully secured. Further, if side coverage can not be secured at the time of forming a barrier metal layer by postoxidation, there is a problem that oxidation arrives in a Cu layer, thereby the adhesiveness with the Cu layer can not be secured. This problem may be avoided by securing a sufficient film thickness of barrier metal layer. However, it is considered that to cope with miniaturization in future would be difficult.

In view of the above problems, in the present embodiment, since a non-nitriding mode (Non-poison mode) TiN film is used, the above problems can be avoided.

Figure 13:
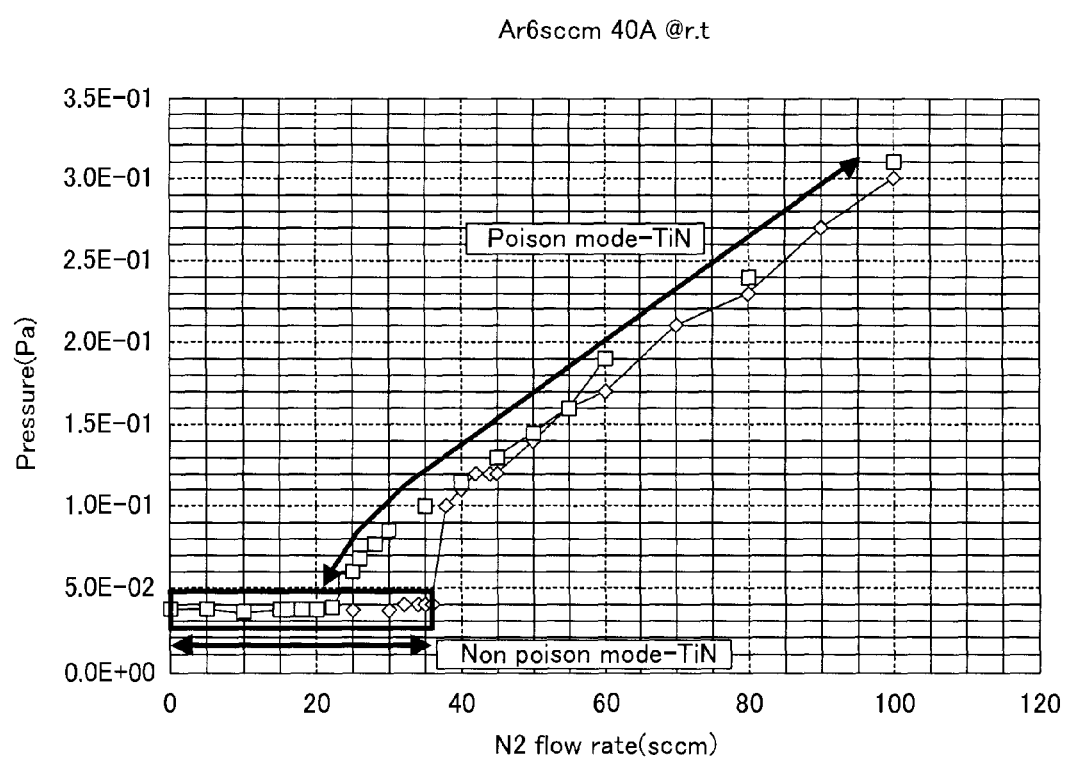
FIG. 13 is a view for explaining the regions of nitriding mode and non-nitriding mode in a $TiN_x$ film.

Until now, in the case of using TiN, nitriding mode (Poison mode) TiN was used (FIG. 13). The reason thereof is that bulk Ti itself has a low barrier property, and a region that the ratio of Ti/N is near to 1:1 has a high barrier property as a barrier film.

On the other hand, as described above, by postoxidation of oxidation sources allowed from the interlayer dielectric film, fine $TiO_x$ type film is formed, thereby the barrier property being secured. In view of the above, the TiN film having regular 1:1 composition is difficult to form a $TiO_x$ film, and the adhesiveness with Cu can not be obtained. Accordingly, it is clear that the degradation of SM property is generated. Therefore, when the technique of postoxidation is used, an initially formed film is a film having a Ti composition of more than Ti:N=1:1.

The inventors studied the relation between the composition of TiN and the detailed electric properties thereof. As the results, it was found that the composition range having good yield and reliability is a 60 at % or more of Ti (N: less than 40 at %), particularly, an excellent range is in a range of 65 at % or more to less than 97 at % of Ti (N: 3 at % or more to less than 35 at %). It was confirmed that the composition having 97 at % or more of Ti has an equal level of property with Ti and the composition having less than 97 at % of Ti has a lower failure ratio than Ti.

This is explained from the binary phase diagram as the followings. Ti—N that is an intermetallic compound has a region in which TiN can be existed stable, with a Ti content of less than 60 at % (N: 40 at % or more) at a processing temperature of 400 to 500° C. With a Ti content of 60 at % or more, there is an eutectic region of Ti rich compound and TiN, and with a larger Ti content, there is an eutectic region of Ti rich compound and Ti. Here, the TiN having a 50 at % or less of Ti is difficult to react with Cu or oxidation sources. But in a region containing much content of Ti, Ti which is easily subjected to the compound reaction with Cu and the oxidation from the interface of the dielectric film are increased. For example, the region in the neighbor of the maximum point of specific resistance of TiNx film is an eutectic region of $Ti_2N$ and Ti, which is easily reacted with Cu and oxidation sources and can have good properties.

Figure 14:
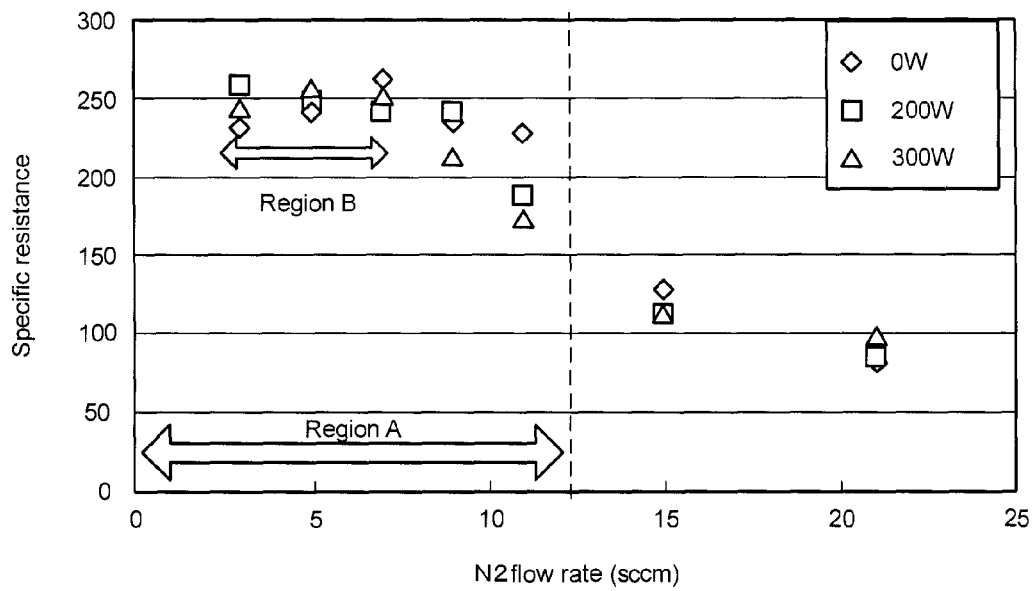
FIG. 14 is a graph showing the dependency of specific resistance of $TiN_x$ film on the flow rate of $N_2$ for forming a film.

FIG. 14 shows the dependency of specific resistance of $TiN_x$ film on the flow-rate of $N_2$ at the film forming. FIG. 14 shows examples of 0 W, 200 W and 300 W. It has a tendency that the resistance is increased with the increase of flow rate of $N_2$, shown in x-axis, and after the appearance of peak the resistance is decreased, without no relation with bias conditions.

Figure 15:
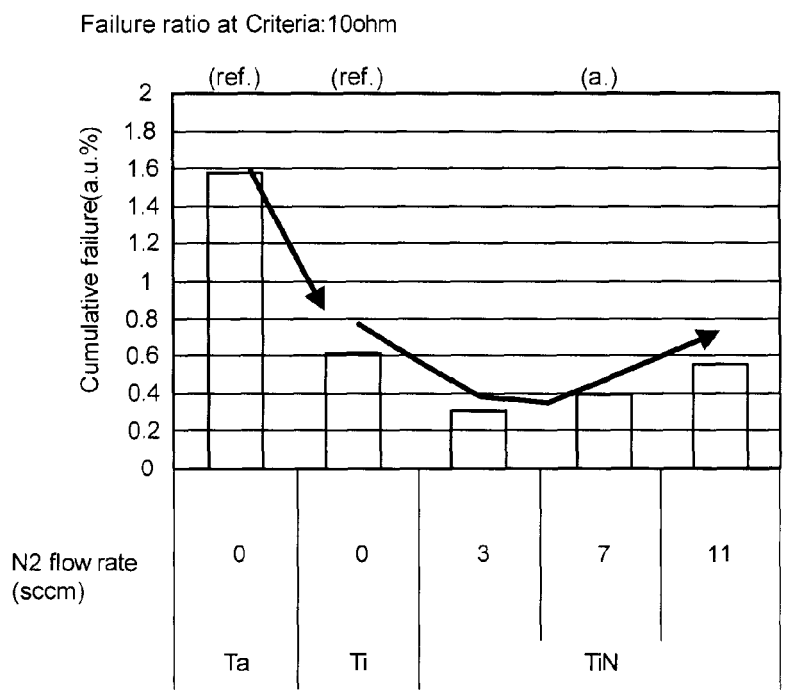
FIG. 15 is a graph showing the failure ratio in the case that various films including $TiN_x$ film are subjected to an accelerated test with respect to the effect of water content.

FIG. 15 shows evaluation results of failure ratio in the cases that various conditions of $N_2$ are applied, and various patterns of covering ratio are measured to evaluate the effects of water being from the surrounding dielectric film. When the barrier metal is completely oxidized due to the surrounding water, the adhesiveness between the barrier metal and Cu is degraded, thereby the failure ratio being increased. In an area having high pattern density, the water including in the dielectric film is decreased by exhausting gases from an opening portion. Therefore, the occurrence of failure due to the oxidation of barrier metal is hard. However, in an area having low pattern density, since the water is not fully exhausted, the oxidation of barrier metal is accelerated so as to easily occur the failure thereof.

As shown in FIG. 15, in the neighbor of the portion of N2=3 to 7 sccm which exhibits the maximum of specific resistance, the failure ratio becomes minimum. As the result of detailed study, in the neighbor of the portion of $N_2$=1 sccm, it was confirmed that the failure ratio is also lower than Ti.

Referring to a graph of specific resistance shown in FIG. 14 and a graph of failure ratio shown in FIG. 15, the $N_2$ composition region A in FIG. 14, which shows a tendency of higher specific resistance, and the $N_2$ composition region B, which shows lower failure ratio, is partly overlapped. Therefore, it is possible to refer the specific resistance as an index of film property.

Further, as the result of the X-ray diffraction measurement of these films, the followings were apparent corresponding to the tendency of specific resistance.

In a region exceeding $N_2$=11 sccm, peaks to which an index exhibiting a composition of Ti:N=1:1 can be attached are observed. In contrast, in the B region having a higher specific resistance in which the specific resistance of TiN is projected to the upper direction, the strength thereof is extremely low, and the broad peak is observed. This is because the film in this region is in a state of micro crystalline.

On the other hand, a region from pure Ti to maximum specific resistance region is confirmed by the X-ray diffraction measurement to be in the micro crystalline state of $Ti_2N$ and Ti. In the state including much Ti composition, since the structure is formed of micro crystalline, the maximum of resistance value is exhibited. Thus, the value of specific resistance is an index exhibiting the state of structure in the film including the composition and crystallinity.

As described above, in a region in which TiN is formed, the forming of $TiO_x$ is difficult. Further, the TiN is crystallized, then the specific resistance thereof is decreased. However, in a region containing Ti where N is added, the specific resistance is increased due to the forming of microcrystalline, as shown in the result of X-ray diffraction test. Further, due to such high specific resistance and high micro crystallization, it is difficult that the oxidation sources pass through to Cu side. Accordingly, it could be explained that the interface with the Cu layer is held with high adhesiveness.

Further, similarly, regarding the composition of layer contacting with the interlayer dielectric film, it is necessary to reserve an amount of Ti which can react with the oxidation sources, when considering the oxidation using the oxidation sources provided from the interlayer dielectric film. That is, nitriding mode (poison mode) TiN is not proper to achieve the object.

Figure 16:
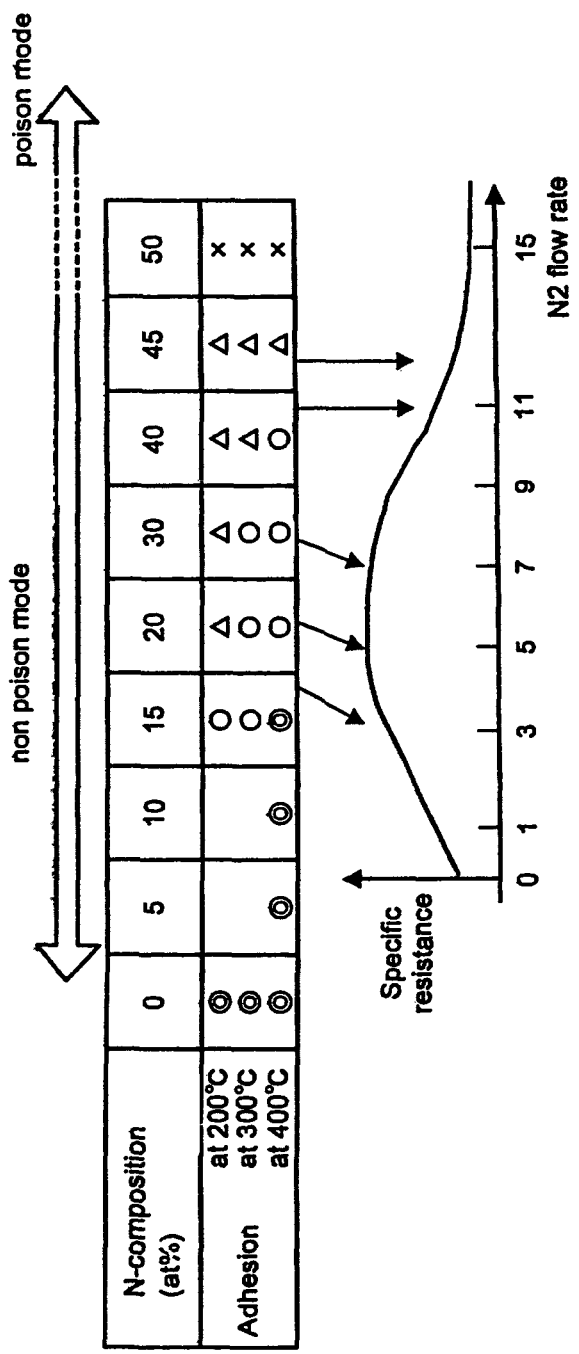
FIG. 16 is a graph showing the adhesive tendency between a $TiN_x$ film and a Cu film.

Next, we will explain as to FIG. 16. Various films having various TiN compositions are formed with various combinations of various flow rates of $N_2$ and substrate biases. Next, a Cu film (plated film) having a thickness of 10 nm is formed on each of the films, at a thickness of 10 nm to form a Cu plated film. Subsequently, each Cu plated film is heat-treated at a temperature of about 200° C., about 300° C., or about 400° C. for about one hour, under a gas atmosphere of $H_2/N_2$ ($H_2$=3 vol %). As to respective samples, the cohesion of Cu is observed, and the specific resistance is also measured.

As shown in FIG. 16, from the view point of TiN composition at the side contacting with the Cu (Cu plated film), in order to secure the adhesiveness with Cu, nitriding mode TiN film has not sufficient adhesiveness with Cu. On the other hand, non-nitriding mode TiN film has sufficient adhesiveness. This is because non-nitriding mode TiN film has an enough amount of Ti for reacting with Cu. Or the TiN is a compound such as $Ti_2N$ which can be readily reacted with Cu. Accordingly, it is possible to secure adhesiveness with Cu. From the above, it is possible to find a desirable region of Ti composition (N composition) at the side contacting with Cu.

Further, the adhesiveness with Cu depends on heat-treating temperature. As the heat-treating temperature is increased, the desirable region of Ti composition (N composition) is extended. In addition, in order to secure the adhesiveness with Cu, it is important that at least one time of heat-treatment is conducted at least at a temperature of 200° C. or more in which the diffusion of Ti generates and further the reaction of forming a compound begins to generate at the interface between the non-nitriding mode TiN film and Cu (plated film).

Based on the above reason, it is clear that the TiN film formed by the conventional nitriding mode does not satisfy required properties. And comparing with the TiN film formed by the non-nitriding mode, the resistance of TiN is lower, but the forming rate thereof is reduced to a half. Thus, the merit of cost is decreased.

Further, according to the method of the present embodiment, the deterioration of film density, which occurs at the time of forming TiON by the compound sputtering method using oxidation sources, does not occurred, thereby good properties being obtained.

Further, regarding the process of oxidation of the barrier metal through oxidation sources remaining in the interlayer dielectric film or the process of forming a predetermined compound in an interface through the reaction between Ti and Cu, it is also possible to conduct in any process of the series of manufacturing processes. Regarding the postoxidation process of the barrier metal, as described in US 2006/0214305 A1, it is possible to conduct after forming the barrier metal film, after forming a seed film, after forming of a plated film, or in any process in the processes of forming a multilayer interconnection. Regarding the forming of predetermined compound in an interface through the reaction between Ti and Cu, it is also possible to conduct after forming a seed film, after forming a plated film, or in any process in the processes of forming a multilayer interconnection.

Second Embodiment

Next, we will describe the relation between the non-nitriding mode TiN film and the applied bias at the time of forming of the TiN film in the above-mentioned first embodiment.

FIG. 17 shows the side coverage property of TiN$_x$ film which was obtained by applying bias for predetermined time. The horizontal axis shows a bias value and the vertical axis shows a film thickness when forming at the predetermined time t1. (a) is a field film thickness, (b) is a film thickness in a shoulder portion which is defined with a film thickness at a shortest distance between an end of opening portion of dielectric film and the surface of metal film formed, (c) is a film thickness in a bottom surface, and (d) is a film thickness in a side portion.

Usually, when forming a film with 1 step, the combination of bias and time is selected so as not to expose the interlayer dielectric film to be patterned by an excess etching of the field and the shoulder portion. On the other hand, a thickness of bottom coverage is increased with the applying of bias. However, when reaching to a bias value, the bottom film thickness begins to decrease due to the occurrence of re-sputtering. The scraped bottom film by the re-sputtering is adhered onto a side. Thus, from the point that the bottom film thickness begins to decrease, the side coverage is rapidly increased.

As mentioned above, to obtain a good side coverage, it is important to determine the combination of the bias and the time up to a region of increasing of side coverage by re-sputtering. However, in case of Ti film, the should portion of is scraped before the re-sputtering. Therefore, it is difficult to improve the side coverage which is important for securing the reliability of device. For this reason, in the case of Ti, for example, the application of bias is limited up to 200 W, at the condition of cathode power 18 kW and Ar: 6 sccm.

However, by the addition of N, the relation between a film thickness of field and shoulder portions and the bias is varied as shown in FIGS. 17 (a) and (b). This is because by the addition of N, the film becomes in state of fine crystalline. Thereby the film is hard so as to delay the rate of scraping by bias, that is, the etching rate of film. The bias dependency of inner coverage is not so varied in slope, as in the field, as shown in FIGS. 17 (c) and (d).

By adding Ti and N mentioned above, since the slope of rate in the field and shoulder portions can be controlled, it is possible to select a bias value that can protect a shoulder portion and a bias in a region where the side coverage is improved by the generation of re-sputtering in bottom. For example, the selection of the condition of N$_2$=11 sccm and 300 W, that is the value exceeding 200 W, can be selected, thereby the coverage being increased. By using this region, the improvement of film properties and coverage can be simultaneously achieved. As above, the variation of etching rate in the field enables to improve the coverage because it is generated in the non-nitriding mode region where a minute amount of N$_2$ is added.

Here, the parameter of film forming in the present embodiment shows an example in case of using a predetermined apparatus. However, since the parameter of film forming for obtaining this relation is varied with the kinds of apparatus, it is a matter of course that the parameter of film forming is different according to respective apparatuses.

FIG. 18 also shows the relation of coverage in a TiN film obtained by the first step of film forming which is conducted with any bias value or without applying of bias and by the second step of film forming which is conducted by applying bias for a fixed time. The horizontal axis shows a bias value, and the vertical axis shows the film thickness of films which are formed at the fixed time t 2 after the first step, respectively. (a) shows a film thickness of field, (b) shows a film thickness in a shoulder portion, defined by a film thickness at the shortest distance between the end of opening portion of a dielectric film and the surface of formed metal film, (c) shows a thickness of bottom film, and (d) shows a thickness of side film.

When the film forming is conducted by 2 steps, the portion of film thickness formed at the first step exists as an amount for shaving. That is, since the interlayer dielectric film for forming a pattern is protected by the film formed at the first step, the selection of bias larger than that at the first step becomes possible. Therefore, higher coverage can be obtained. At this time, if N$_2$ is added at the first step, etching thereof becomes hard. Accordingly, if the film forming of Ti is conducted at the second step, the applying of higher bias becomes possible, thereby the control of coverage being possible.

For example, at the first step, by suitably selecting a bias from 0 to 300 W at the condition of cathode power 18 kW, Ar: 6 sccm, and N$_2$: 3 to 11 sccm, a TiN$_x$ film is formed not to be scraped from the shoulder portion. Next, at the second step, by selecting a higher bias from 300 to 700 W at the condition of Ar: 6 sccm and N$_2$: 0 sccm, a Ti film can be formed. At this time, it is not desirable to form an amount of scraping of shoulder portion by Ti. Instead, since the etching becomes difficult due to the addition of N$_2$, it becomes to be possible to apply for longer time at the second step in a state that the film thickness of shoulder portion is left. Or even if the bias applying time is equal, the application of bias can be applied to the bias value higher than that at the time of film forming by Ti at the first step.

Thereby, as shown in FIG. 18, it is possible to select a bias such that a film thickness is decreased due to re-sputtering in a bottom, and is increased in a side coverage.

Here, this example shows that by controlling a flow rate of N$_2$ at the first step, the bias value of Ti at the second step can be selected to improve the coverage. It is possible to control also in the case of addition of N$_2$ at the second step. For example, even when the flow rate of N$_2$ is the same, as a combination of bias steps, by that N$_2$ is added at the second step, it becomes possible to apply higher bias than the case of Ti.

For example, in the above concrete example, the film forming is conducted at the condition of: cathode power of 18 kW, Ar: 6 sccm, and N$_2$: 3 sccm, and at the second step N$_2$ is added at the rate of 3 sccm. Thereby, the protected amounts in the field and shoulder were controlled as shown in FIGS. 17 (a) and (b), FIGS. 18 (a) and (b). Thus, it is possible to apply bias at the second step for longer time than the time of film forming of Ti, or to apply higher bias with the same applying time of bias.

Further, at the second step, by similarly controlling an amount of N$_2$ and setting bias so that a high bias can be applied, the film thickness of bottom can be decreased due to re-sputtering, and the side coverage can be improved. Therefore, the coverage can be further improved.

As mentioned above, the present embodiment describes the relation between the flow rate of N$_2$ and the bias of the substrate in the case that attention pays to the improvement of side coverage in the TiN having more than 50 at % of Ti. In the present embodiment, the combination of the bias of substrate was described with respect to the case of one layer and two layers of barrier metal. However, it is also possible to select the bias of substrate, in the case that TiN having a Ti composition of more than 50 at % of Ti, that is a non-nitriding mode TiN film is included, and in case of having a film constitution exceeding the two layers. Further, film forming parameters described in the present embodiment are one example when an apparatus is used. Therefore, it is natural that the film forming parameters for obtaining the relation are different depending on respective apparatus.

Third Embodiment

Next, we will describe an overhang ratio, side coverage ratio, and bottom coverage ratio of non-nitriding mode TiN films which are formed in the abovementioned the first embodiment and/or the second embodiment.

Figure 19:
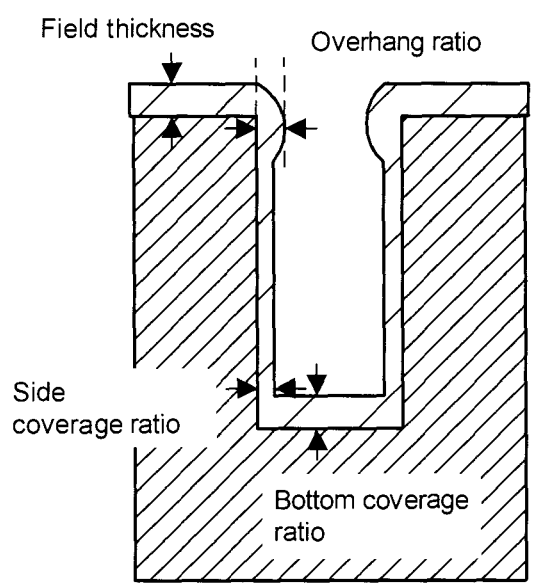
FIG. 19 is a view for explaining respective components such as an overhang ratio, side coverage ratio, and bottom coverage ratio and the like of $TiN_x$ film in a non-nitriding mode.
Figure 20:
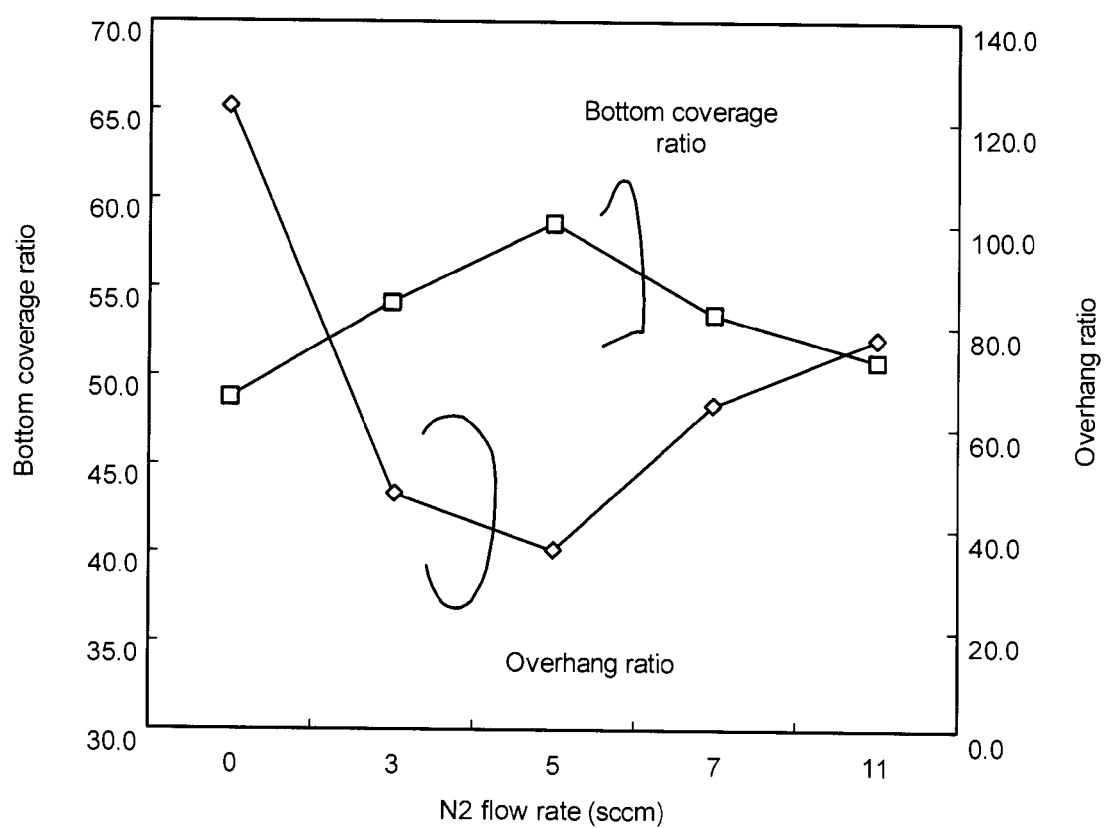
FIG. 20 is a graph showing an overhang ratio and bottom coverage ratio of $TiN_x$ film in various flow rate of $N_2$.
Figure 21:
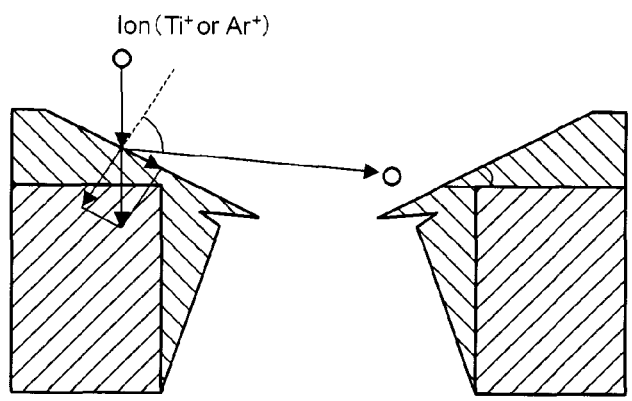
FIG. 21 is a view for schematically explaining the film forming process of TiN film near the frontage of opening portion.
Figure 21:
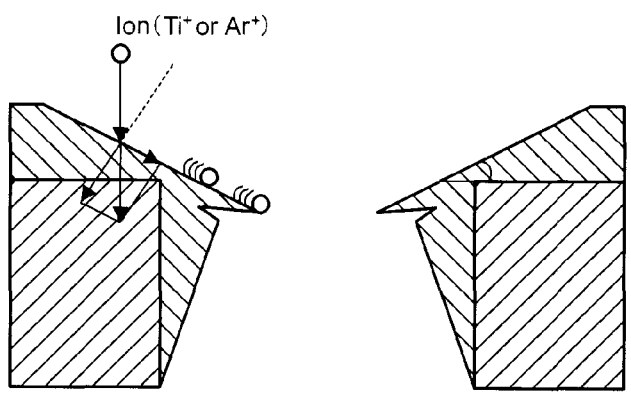
Figure 21:
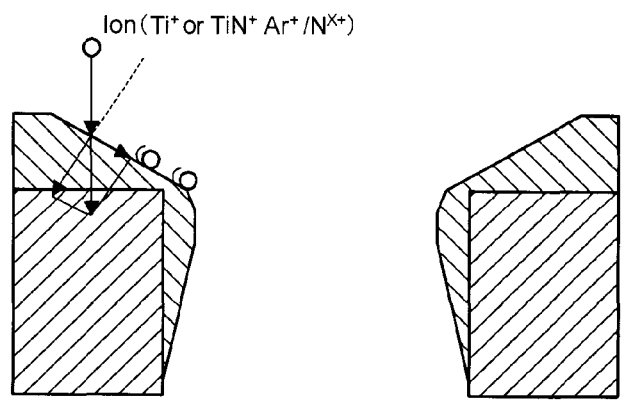
Figure 22:
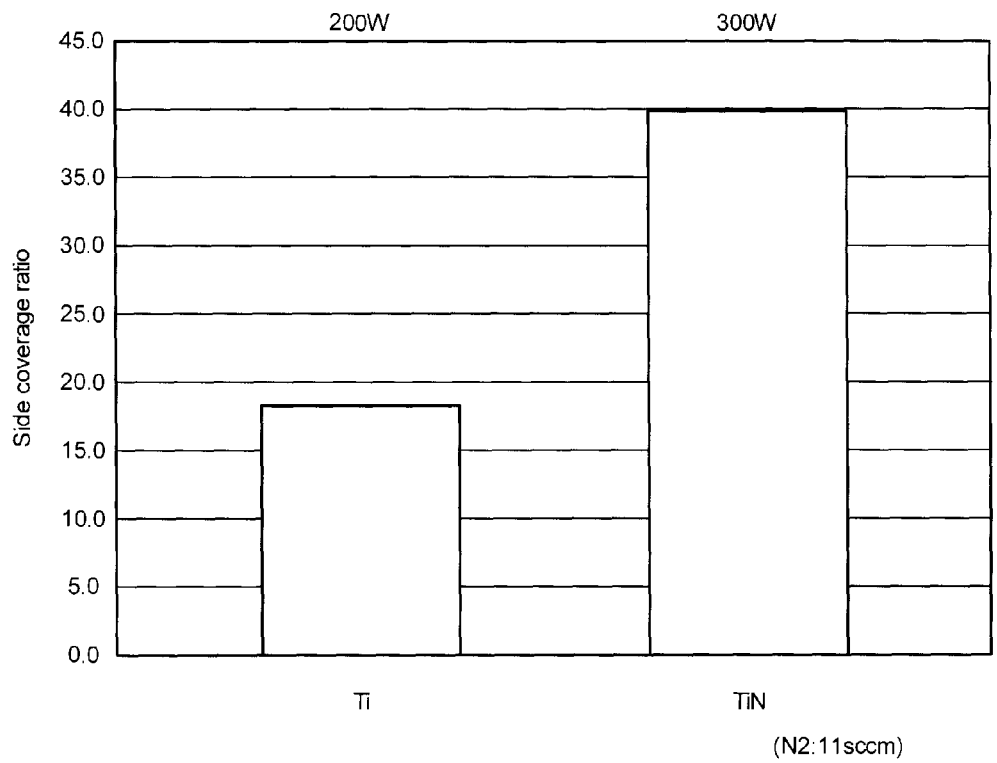
FIG. 22 is a graph showing the relation between the possible applying bias to Ti film and $TiN_x$ film and the side coverage thereof.

FIG. 19 is a view for explaining (defining) various components of an overhang ratio, side coverage ratio, bottom coverage ratio, and the like in the above mentioned non-nitriding mode TiN film. FIG. 20 is a graph showing the overhang ratio and bottom coverage ratio of the TiN film in the various flow rates of $N_2$, wherein the values are mean values. FIG. 21 a view for schematically explaining the growing processes of TiN film near the opening portion. Further, FIG. 22 is a graph showing the relation between the bias which can be applied to the Ti film and TiN film and the side coverage.

In the ion sputtering, a temperature of wafer is easily increased when forming a film while applying a bias. In the case of Ti having a low melting point, a surface migration easily occurs (FIG. 21(b)). As the result, a horn-like projection is grown, thereby the overhang ratio being increased.

However, as shown in FIG. 20, when increasing the addition of $N_2$, the overhang is suppressed. Then, the number of induced metal ions into the opening, thereby the bottom coverage being increased. This is because since a melting point of the film is increased, the migration on a surface of the film is suppressed, thereby the overhang being suppressed (FIG. 21(c)).

Further, as previously described, in a region of flow rate of $N_2$ where the overhang can be suppressed, the obtained TiN film becomes to be constituted of microcrystals, and the film itself growing on initial deposited film does not follow the crystal property, and the growth of film having emphasized anisotropy crystal grains does not occur. Accordingly, together with the suppression effect of migration mentioned above, it is possible to satisfactorily secure the opening and the coverage of the internal portion.

Furthermore, since Ti is shallow in the release probability of metal at the time of re-sputtering, and the frontage of opening portion is scraped (FIG. 21 (a)), a bias exceeding about 200 W can not be applied. However, by the addition of $N_2$, for example, a high bias of 300 W can be applied without the scraping of shoulder in the frontage. For this reason, as shown in FIG. 22, it is possible to improve the side coverage using re-sputtering of the bottom film.

Further, in the above embodiments, an example of the formation of a TiN film containing more than 50 at % of Ti in a non-nitriding mode is shown. However, it is also possible to form a similar film by heating the surface of Ti film being dense and active while flowing $N_2$ or in an atmosphere of $N_2$.

In the above embodiments, we described with respect to the sputtering method which is the PVD method, and the film constituted of dual composition of Ti:N. However, it is also possible to apply the CVD method and ALD method. Further, materials other than oxygen (O) and precious metallic components are also applicable in addition to Ti and N. For example, with respect to the composition of 60 at % of Ti and 40 at % of N, in the case of MOCVD, the composition having 40 at % including C and N, in the case of TiN in the TiCl raw material base, similarly the composition having 40 at % including N and Cl can be considered to be equivalent. This is because Ti composition of more than 50 at % in all components excluding oxygen (O) and precious metals is to be considered.

Fourth Embodiment

Next, we will describe the variation of embodiments 1 to 3. In the present embodiment, in a non-nitriding mode TiN film, the third component Ru is contained. That is, on a surface of an interlayer dielectric film 50 of a structural body which is formed according to the processes shown in FIGS. 1 to 8, a non-nitriding mode TiN film containing Ru, a $TiRu_yN_x$ film is formed as a barrier metal layer, and thereon the second interconnection layer 70 including the second Cu plated layer is formed according to the processes shown in FIGS. 10 to 12.

The $TiRu_yN_x$ film mentioned above can be formed as the following processes similarly with the case of non-nitriding mode TiN film 30b. A structural body shown in FIG. 8 is conveyed in an ionized sputtering chamber, and is set on a susceptor which is set at a desired temperature. Thereafter, the structural body is absorbed on the susceptor, and is held at the same temperature as that of the susceptor. In this state, into the sputtering chamber at a low pressure, Ar gas for generating sputtering is introduced, for example, at 6 to 8 sccm, and for example, a minute amount of $N_2$ at 1 to 11 sccm, and using an ionized sputtering method and using a molten or mosaic target composed of Ti and Ru as a target, for example, at the substrate bias of 0 to 1000 w to a cathode condition of 40 A, for example, a single layer of $TiRu_yN_x$ film having a thickness of 10 nm is formed. At this time, the substrate bias values for obtaining a good coverage are properly selected, respectively.

The $TiRu_yN_x$ film is also formed at a second substrate temperature lower than the first substrate temperature at the heat treatment for removing oxidation sources in the interlayer dielectric film 50, similarly with the case of TiN film 30b. Concretely, when the heat treatment for removing the oxidation sources was conducted at a temperature of 250° C., the $TiRu_yN_x$ film is formed at a temperature of less than 250° C. Further, when the heat treatment was conducted at 300° C., the $TiRu_yN_x$ film is formed at a temperature of less than 300° C.

We will describe an effect caused by containing Ru in the non-nitriding mode TiN film as the third component. Also in the alloy system containing such Ru, as in the case of the non-nitriding mode TiN film 30b, a film for suppressing the progress of oxidation at the interface with Cu by the postoxidation at the interface where the $TiRu_yN_x$ film contacts with the interlayer dielectric film is formed, wherein the progress of oxidation at the interface with Cu is caused due to oxidation sources in the interlayer dielectric film. Further, at an interface where the TiRuyNx film contacts with Cu, when the Cu seed film becomes thin, there is anxiety that the barrier metal will be exposed. However, because Ru having a catalytic effect to the plating is therein, this case is more advantageous than the case of the exposure of Ti only for the Cu plating. Further, similarly with the case of TiN, Ti diffuses into Cu, and segregates in grain boundaries, thereby the migration of Cu being suppressed. Accordingly, when the Cu seed film is a thin film, the effects of addition of Ru can be appeared.

Further, in the case that Cu is buried with the CVD method, similar effects can be obtained. For example, we will describe the case of using Cu(hfac)TMVS as a common gas source. Here, hfac and TMVS are abbreviations of hexafluoroacetylacetonate and trimethylvinylsilane, respectively. Comparing with Ti and Cu, since Ti has a larger formation energy of oxidation in negative, the transfer of charge to Cu is difficult, and contrary hfac radicals are absorbed to Ti side. Thus, a carbon type impurity layer including fluorine (F) is easily formed at the Ti/Cu interface. By contrast, when a $TiN_x$ film as in the present embodiment is used, the relation of charge transferring between Ti and Cu is changed, and the charge transfer to Cu is easily performed. Thus, without forming of impurities the film forming of Cu is easily proceeded. In addition, in the Ru of the present embodiment, Cu has a larger formation energy of oxidation in negative than Ru, the charge transfer is easily formed in Cu. Thus, the film forming of Cu on the barrier metal including Ru is more accelerated.

In the present embodiment, an example of using of Ru as a third component was described. However, other third component other than Ru may be also used if the component or its oxide has good adhesiveness with Cu and the component has a catalytic effect at the time of plating. As the component, precious metals such as Pd, Pt, Au and the like are exemplified other than Ru. Further, it is possible to use a combination thereof.

Fifth Embodiment

We will describe the fifth embodiment, as follows; on the non-nitriding mode TiN film or $TiRu_yN_x$ film mentioned above, a Ti film or $TiRu_yN_x$ film is laminated, and the processes shown in FIGS. 10 to 12 are conducted thereon so as to form a second interconnection layer 70 including a second Cu plated layer.

Figure 23:
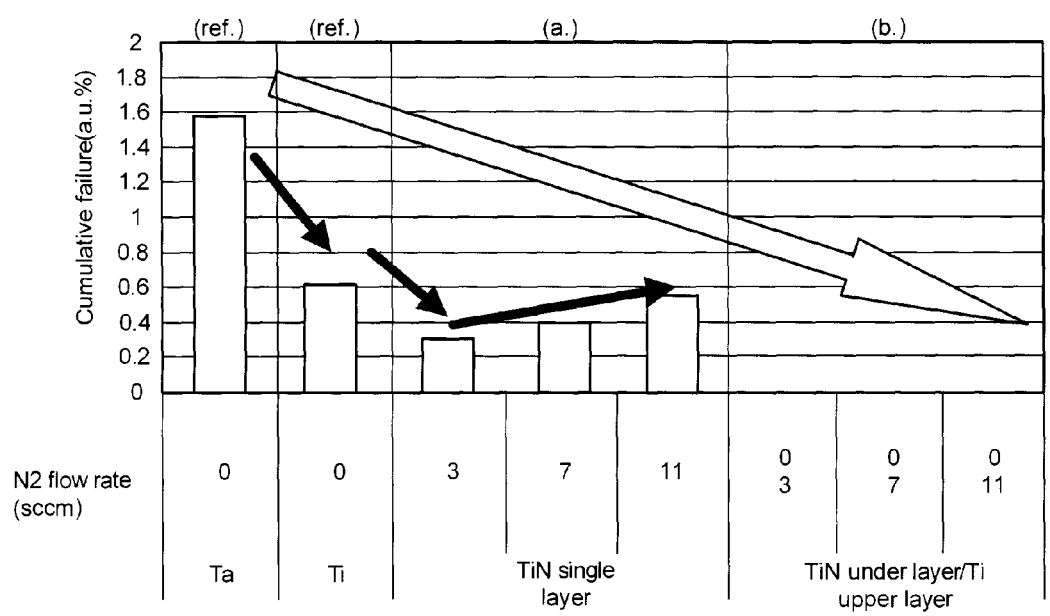
FIG. 23 is a graph showing respective failure ratios produced by laminating, in the case of forming a Cu plated film (interconnection layer) on a single layered TiN film in non-nitriding mode and in the case of forming a Cu plated film (interconnection layer) on a laminate film of TiN film (under layer)/Ti film (upper layer) in non-nitriding mode.

FIG. 23 is a graph showing failure ratios occurred accompanying with laminating, in respective laminating processes comprising forming a Cu plated film (interconnection layer) on a single layered non-nitriding mode TiN film, and forming a Cu plated film (interconnection layer) on a non-nitriding mode laminated film composed of TiN film (under layer)/Ti film (upper layer). Further, FIG. 23 shows a failure ratio in the case of forming a Cu plated layer (interconnection layer) on a single layered Ta film and Ti film as a reference.

As clearly shown in FIG. 23(a), when the Cu-plated film is formed on the single layered non-nitriding mode TiN film, comparing with the Ta film and Ti film, the failure ratio is decreased and improved at the neighbor of the condition of $N_2$ where the specific resistance becomes maximum, with some dispersions. Further, as shown in FIG. 23(b), when the Cu-plated film is formed on the laminated film composed of non-nitriding mode TiN film (under layer)/Ti film (upper layer), the failure ratio is further decreased than the case of a Cu plated layer (interconnection layer) on the single layered non-nitriding mode TiN film in FIG. 23(a).

This is because the Ti film of upper layer is reacted with the Cu plated film with each other, and forms a predetermined compound, thereby the adhesiveness between the laminate film of non-nitriding mode TiN film (under layer)/Ti film (upper layer) and the Cu plated film being increased.

Next, we will describe the effect based on that in the laminate structure of TiN and Ti, the under layer TiN is formed in a non-nitriding mode. In a dual damascene structure, when a TiN/Ti structural body is formed in a via hole, an under layer Cu is contacted with the TiN. It is known that voids are easily formed in the bottom portion of via hole to the under layer interconnection at the time of stress-migration test. If the adhesiveness between Cu and barrier metal is inferior, the voids in the bottom of via hole is more easily formed. In the case that the barrier metal layer is formed of two layers of TiN/Ti, the voids in the bottom of via hole can be suppressed, because TiN in non-nitriding mode which easily forms a compound with Cu contacts with the Cu. Furthermore, since TiN formed as the under layer has a micro-crystal structure formed in non-nitriding mode, the orientation of Ti formed thereon is broken such that the growth of grains is difficult to protrude in one direction, thereby a horn-like growth thereof being difficult. Therefore, an overhang of Ti film laminated as the upper layer can be suppressed.

Further, in the present embodiment, a laminate composed of a TiN film and a Ti film is shown. However, it is possible to laminate a TiN film containing more Ti component than the lower TiN film, or to laminate a TiN film in which the Ti composition is continuously or step by step increased from a Ti composition in the lower TiN film to, for example, 100 at. % (that is, Ti only) instead of the upper Ti film. In this case, a horn-type growth caused by migration at the surface of Ti film can be suppressed. Further, by properly selecting the composition, the good effect of a reaction between Ti and Cu can be obtained.

Further, a structure, which laminates $TiRu_y$ instead of Ti, can obtain the same effect as the structure of Ti laminated structure. In addition, since the film structure includes Ru, when forming a film with Cu plating and CVD, the effects as described in the fifth embodiment can be appeared. That is, when a Cu seed film is thin, there is an anxiety of exposure of barrier metal. However, since Ru which has a catalytic effect to Cu plating is included, comparing with the case that Ti is only exposed, it is advantageous for Cu plating. In addition, when the burying of Cu is conducted by the CVD method, since the oxidation formation energy of Ru is lower than Cu, for example, when usual feed gas such as Cu (hfac) TMVS is used, direct film forming on the barrier metal layer becomes easy due to existence of Ru.

Here, the two layer structure of $TiRu_yN_x/TiRu_y$ where the composition of $TiRu_y$ of under layer is different from that of upper layer, that is, the two layer structure of $TiRu_{y1}N_x/TiRu_{y2}$ (y1≠y2), can be formed continuously under vacuum atmosphere using targets respective different composition ratios of Ti and Ru. In the above formula, y1 may be 0 or y2 may be 0.

Further, in the composition of $TiRu_y$ or TiRuy2 of upper layer, it is possible to use Pd, Pt, Au and the like instead of Ru and to use together two or more kinds thereof, as described regarding the $TiRu_yN_x$ in the fourth embodiment.

As described above, we have described the present invention referring to the embodiments. However, the present invention is not limited to the embodiments, it will be understood by those skilled in the art that further modifications will be apparent in view of disclosure, and fall within the scope of the invention.

What is claimed is:

1. A semiconductor device comprising:
   an interlayer dielectric film having an opening portion on a surface thereof;
   a first layer formed on the interlayer dielectric film and containing Ti and N, wherein a Ti content in the first layer is more than 50 at % in all components, provided that oxygen and precious metals are excluded from the all components;
   a second layer of Ti or TiM, wherein M represents a precious metal element, formed on the first layer; and
   a Cu metal layer formed on the second layer to bury the opening portion in the interlayer dielectric film,
   wherein the first layer comprises an oxidized Ti film on or near the surface thereof facing the interlayer dielectric film.

2. The semiconductor device according to claim 1, wherein the Ti content in the first layer is 60 at % or more.

3. The semiconductor device according to claim 1, wherein the Ti content in the first layer is in a range of 65 to 97 at %.

4. The semiconductor device according to claim 1, wherein the first layer further contains at least one metal selected from precious metals.

5. The semiconductor device according to claim 1, wherein the first layer comprises a micro crystalline state.

6. The semiconductor device according to claim 1, wherein a compound of Ti with Cu is present at the interface between the second layer and the Cu metal layer.

7. The semiconductor device according to claim 1, wherein the opening portion comprises a via hole, the bottom of the via hole being contacted with an under layer of Cu, and a compound of Ti with Cu is present at the interface between the under layer of Cu and the first layer formed at the bottom of the via-hole.

8. A semiconductor device comprising:
an interlayer dielectric film having an opening portion on a surface thereof;
a TiN layer formed on the interlayer dielectric film and containing Ti and N, wherein a Ti content in the TiN layer is more than 50 at % in all components, provided that oxygen is excluded from the all components;
a Ti layer formed on the TiN layer; and
a Cu metal layer formed on the Ti layer to bury the opening portion formed in the interlayer dielectric film,
wherein the TiN layer comprises an oxidized Ti film on or near the surface thereof facing the interlayer dielectric film.

9. The semiconductor device according to claim 8, wherein the Ti content in the TiN layer is 60 at % or more.

10. The semiconductor device according to claim 8, wherein the Ti content in the TiN layer is in a range of 65 to 97 at %.

11. The semiconductor device according to claim 8, wherein the TiN layer comprises a micro crystalline state.

12. The semiconductor device according to claim 8, wherein a compound of Ti with Cu is present at the interface between the Ti layer and the Cu metal layer.

13. The semiconductor device according to claim 8, wherein the opening portion comprises a via hole, the bottom of the via hole being contacted with an under layer of Cu, and a compound of Ti with Cu is present at the interface between the under layer of Cu and the TiN layer formed at the bottom of the via-hole.

* * * * *